US012406902B2

(12) United States Patent
Tanaka

(10) Patent No.: US 12,406,902 B2
(45) Date of Patent: Sep. 2, 2025

(54) VAPOR CHAMBER AND MANUFACTURING METHOD OF VAPOR CHAMBER

(71) Applicant: FURUKAWA ELECTRIC CO., LTD., Tokyo (JP)

(72) Inventor: Kengo Tanaka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 202 days.

(21) Appl. No.: 18/000,473

(22) PCT Filed: Jun. 4, 2021

(86) PCT No.: PCT/JP2021/021371
§ 371 (c)(1),
(2) Date: Dec. 1, 2022

(87) PCT Pub. No.: WO2021/246519
PCT Pub. Date: Dec. 9, 2021

(65) Prior Publication Data
US 2023/0215777 A1    Jul. 6, 2023

(30) Foreign Application Priority Data

Jun. 4, 2020 (JP) ................................. 2020-098035

(51) Int. Cl.
*H01L 23/427* (2006.01)
*B23P 15/26* (2006.01)
*H01L 21/48* (2006.01)

(52) U.S. Cl.
CPC ............ *H01L 23/427* (2013.01); *B23P 15/26* (2013.01); *H01L 21/4871* (2013.01); *B23P 2700/09* (2013.01)

(58) Field of Classification Search
CPC .... H01L 23/427; H01L 21/4871; B23P 15/26; B23P 2700/09

(Continued)

(56) References Cited

U.S. PATENT DOCUMENTS 6,269,866 B1 *  8/2001  Yamamoto .......... F28D 15/0233
                                            174/15.2
6,880,626 B2 *  4/2005  Lindemuth ......... F28D 15/0233
                                            174/15.2

(Continued)

FOREIGN PATENT DOCUMENTS

JP    11-183067 A     7/1999
JP   2001-91172 A     4/2001

(Continued)

OTHER PUBLICATIONS

International Search Report mailed on Jul. 6, 2021 in PCT/JP2021/021371 filed on Jun. 4, 2021 (3 pages).

*Primary Examiner* — Claire E Rojohn, III
(74) *Attorney, Agent, or Firm* — Oblon, McClelland, Maier &Neustadt, L.L.P.

(57) ABSTRACT

A vapor chamber includes a working fluid in an internal space formed between a first metal sheet and a second metal sheet, in which the first metal sheet includes a recessed channel, at least one projecting part, and at least one flow channel groove. The recessed channel is provided at an inner surface of the first metal sheet, the projecting part projects from the inner surface of the first metal sheet toward an inner surface of the second metal sheet, and a top face of the projecting part abuts the inner surface of the second metal sheet. The flow channel groove has a bottom groove part, a side face groove part and a top face groove part. The bottom groove part is provided at a bottom face of the recessed channel, the side face groove part is provided at a side face of the projecting part, and is connected to the bottom groove part, and the top face groove part is provided at the top face of the projecting part, and is connected to the side face groove part.

11 Claims, 8 Drawing Sheets

(58) Field of Classification Search
USPC .................................................. 165/104.26
See application file for complete search history.

(56) References Cited

U.S. PATENT DOCUMENTS

| | | | | |
|---|---|---|---|---|
| 10,973,151 | B2* | 4/2021 | Wakaoka | F28D 15/0233 |
| 11,340,022 | B2* | 5/2022 | Wakaoka | H05K 7/20336 |
| 11,421,942 | B2* | 8/2022 | Kume | F28D 15/0233 |
| 11,448,470 | B2* | 9/2022 | Chan | F28F 21/084 |
| 11,486,651 | B2* | 11/2022 | Wang | F28D 15/046 |
| 11,497,141 | B2* | 11/2022 | Koo | F28D 15/0283 |
| 11,635,263 | B2* | 4/2023 | Chen | F28D 15/04 165/104.26 |
| 11,740,029 | B2* | 8/2023 | Wakaoka | B23K 31/00 165/104.26 |
| 11,747,092 | B2* | 9/2023 | Chen | F28D 15/0233 165/104.26 |
| 11,765,861 | B2* | 9/2023 | Yang | H01L 23/3736 165/104.26 |
| 11,985,796 | B2* | 5/2024 | Yeh | F28D 15/046 |
| 11,988,453 | B2* | 5/2024 | Lewis | F28F 21/085 |
| 12,078,423 | B2* | 9/2024 | Inagaki | F28D 15/0266 |
| 12,082,381 | B2* | 9/2024 | Yurchenko | H05K 7/20445 |
| 12,104,856 | B2* | 10/2024 | Lewis | F28D 15/046 |
| 12,111,114 | B2* | 10/2024 | Huang | F28D 15/0283 |
| 2002/0108333 | A1* | 8/2002 | Clayton | E04B 1/70 52/302.1 |
| 2004/0211549 | A1* | 10/2004 | Garner | F28D 15/046 431/325 |
| 2005/0280128 | A1* | 12/2005 | Mok | H01L 23/427 257/E23.088 |
| 2005/0280162 | A1* | 12/2005 | Mok | H01L 24/31 257/E23.088 |
| 2007/0056711 | A1* | 3/2007 | Ohsawa | B23P 15/26 165/104.21 |
| 2007/0295486 | A1* | 12/2007 | Su | F28D 15/046 165/104.26 |
| 2008/0216994 | A1* | 9/2008 | Lee | F28D 15/0233 29/890.03 |
| 2009/0040726 | A1* | 2/2009 | Hoffman | F28D 15/0233 29/890.032 |
| 2009/0145586 | A1* | 6/2009 | Yoshida | H01L 23/427 165/146 |
| 2010/0071879 | A1* | 3/2010 | Hou | F28D 15/046 29/890.032 |
| 2012/0186784 | A1* | 7/2012 | Yang | F28D 15/0266 165/104.21 |
| 2013/0025829 | A1* | 1/2013 | Huang | F28D 15/0233 165/104.26 |
| 2014/0166244 | A1* | 6/2014 | Dai | F28D 15/0233 29/890.032 |
| 2014/0345832 | A1* | 11/2014 | Lin | F28D 15/046 165/104.26 |
| 2016/0290739 | A1* | 10/2016 | Mochizuki | F28F 3/046 |
| 2017/0023308 | A1* | 1/2017 | Huang | F28F 3/00 |
| 2017/0229375 | A1* | 8/2017 | Haj-Hariri | H01L 24/16 |
| 2019/0141855 | A1* | 5/2019 | Inagaki | H01L 23/427 |
| 2021/0095930 | A1* | 4/2021 | Inagaki | F28D 15/0233 |
| 2021/0136955 | A1* | 5/2021 | Wakaoka | F28D 15/046 |
| 2021/0392781 | A1* | 12/2021 | Oda | F28D 15/046 |
| 2022/0390184 | A1* | 12/2022 | Chen | F28D 15/04 |
| 2023/0215777 | A1* | 7/2023 | Tanaka | F28D 15/04 165/104.26 |
| 2023/0258416 | A1* | 8/2023 | Tanaka | F28D 15/0233 165/170 |
| 2024/0011716 | A1* | 1/2024 | Tanaka | H05K 7/20 |
| 2024/0172395 | A1* | 5/2024 | Oda | F28D 15/02 |

FOREIGN PATENT DOCUMENTS

| | | |
|---|---|---|
| JP | 2016-188734 A | 11/2016 |
| JP | 2017-83042 A | 5/2017 |
| JP | 2018-128208 A | 8/2018 |
| JP | 2019-207076 A | 12/2019 |
| TW | I690684 B * | 4/2020 |

* cited by examiner

VAPOR CHAMBER AND MANUFACTURING METHOD OF VAPOR CHAMBER

TECHNICAL FIELD

The present disclosure relates to a vapor chamber and a manufacturing method of a vapor chamber.

BACKGROUND ART

Electronic components such as semiconductor elements mounted in electrical/electronic devices such as notebook computers, digital cameras and mobile telephones are in a trend of increasing heat generation amount, due to the high-density mounting accompanying improved performance. In order to correctly drive an electrical/electronic device over a long period, it is necessary to efficiently cool the electronic components.

For example, Patent Document 1 discloses a vapor chamber including a first metal sheet and a second metal sheet, in which the first metal sheet has a first flow passage concave part, a first bottom surface groove and first flow passage projection parts. With the vapor chamber of Patent Document 1, the first bottom surface groove has a width smaller than a gap between a first flow passage projection part adjacent to the first bottom surface groove on one side in the width direction of the first bottom surface groove, and a first flow passage projection part adjacent to the first bottom surface groove on the other side, when viewing along the longitudinal direction of the first bottom surface groove.

The vapor chamber of Patent Document 1 attempts an improvement in the heat transport efficiency by the first bottom surface groove and the first flow passage projection part having predetermined arrangement relation. However, it is insufficient in addressing the demand of cooling performance of the electrical/electronic device which are increasing in recent years.

Patent Document 1: Japanese Unexamined Patent Application, Publication No. 2018-128208

DISCLOSURE OF THE INVENTION

Problems to be Solved by the Invention

An object of the present disclosure is to provide a vapor chamber having superior heat transport characteristics, as well as a manufacturing method of the vapor chamber.

Means for Solving the Problems

According to a first aspect of the present disclosure, a vapor chamber includes a working fluid in an internal space formed between a first metal sheet and a second metal sheet, in which the first metal sheet comprises a recessed channel, at least one projecting part, and at least one flow channel groove; the recessed channel is provided at an inner surface of the first metal sheet; the projecting part projects from the inner surface of the first metal sheet toward an inner surface of the second metal sheet, and a top face of the projecting part abuts the inner surface of the second metal sheet; the flow channel groove has a bottom groove part, a side face groove part and a top face groove part; the bottom groove part is provided at a bottom face of the recessed channel; the side face groove part is provided at a side face of the projecting part, and is connected to the bottom groove part; and the top face groove part is provided at the top face of the projecting part, and is connected to the side face groove part.

According to a second aspect of the present disclosure, in the vapor chamber as described in the first aspect, the flow channel groove has a groove depth d and a groove width w, and the groove depth d is longer than the groove width w.

According to a third aspect of the present disclosure, in the vapor chamber as described in the first or second aspect, a ratio ($t_2/t_1$) of a sheet thickness $t_2$ at the projecting part of the first metal sheet relative to a sheet thickness $t_1$ at the recessed channel of the first metal sheet is 0.1 or more and 10.0 or less.

According to a fourth aspect of the present disclosure, in the vapor chamber as described in any one of the first to third aspects, the first metal sheet includes a plurality of the flow channel grooves, and has a crossing part at which the plurality of the flow channel grooves intersect.

According to a fifth aspect of the present disclosure, a manufacturing method of the vapor chamber as described in any one of the first to fourth aspects includes: a laser processing step of forming at least the side face groove part among the flow channel groove of the first metal sheet by laser.

According to a sixth aspect of the present disclosure, in the manufacturing method of the vapor chamber as described in the fifth aspect, the flow channel groove is formed by laser in the laser processing step.

According to a seventh aspect of the present disclosure, the manufacturing method of the vapor chamber as described in the fifth or sixth aspect further includes a press processing step of forming the recessed channel and the projecting part of the first metal sheet by press molding, prior to the laser processing step.

According to an eighth aspect of the present disclosure, the manufacturing method of the vapor chamber as described in any one of the fifth to seventh aspects further includes a laser welding step of welding the first metal sheet and the second metal sheet by laser, after the laser processing step.

Effects of the Invention

According to the present disclosure, it is possible to provide a vapor chamber having superior heat transport characteristics, as well as a manufacturing method of the vapor chamber.

PREFERRED MODE FOR CARRYING OUT THE INVENTION

Hereinafter, an embodiment will be explained in detail.

The present inventors, as a result of thorough examination, achieved an improvement in heat transport characteristics by suppressing the disturbance in flow of a liquid-phase working fluid to efficiently circulate the liquid-phase working fluid and the gas-phase working fluid in a vapor chamber.

A vapor chamber of the embodiment includes a working fluid in an internal space formed between a first metal sheet and a second metal sheet, in which the first metal sheet comprises a recessed channel, at least one projecting part, and at least one flow channel groove; the recessed channel is provided at an inner surface of the first metal sheet; the projecting part projects from the inner surface of the first metal sheet toward an inner surface of the second metal sheet, and a top face of the projecting part abuts the inner surface of the second metal sheet; the flow channel groove has a bottom groove part, a side face groove part and a top face groove part; the bottom groove part is provided at a bottom face of the recessed channel; the side face groove part is provided at a side face of the projecting part, and is connected to the bottom groove part; and the top face groove part is provided at the top face of the projecting part, and is connected to the side face groove part.

Figure 1:
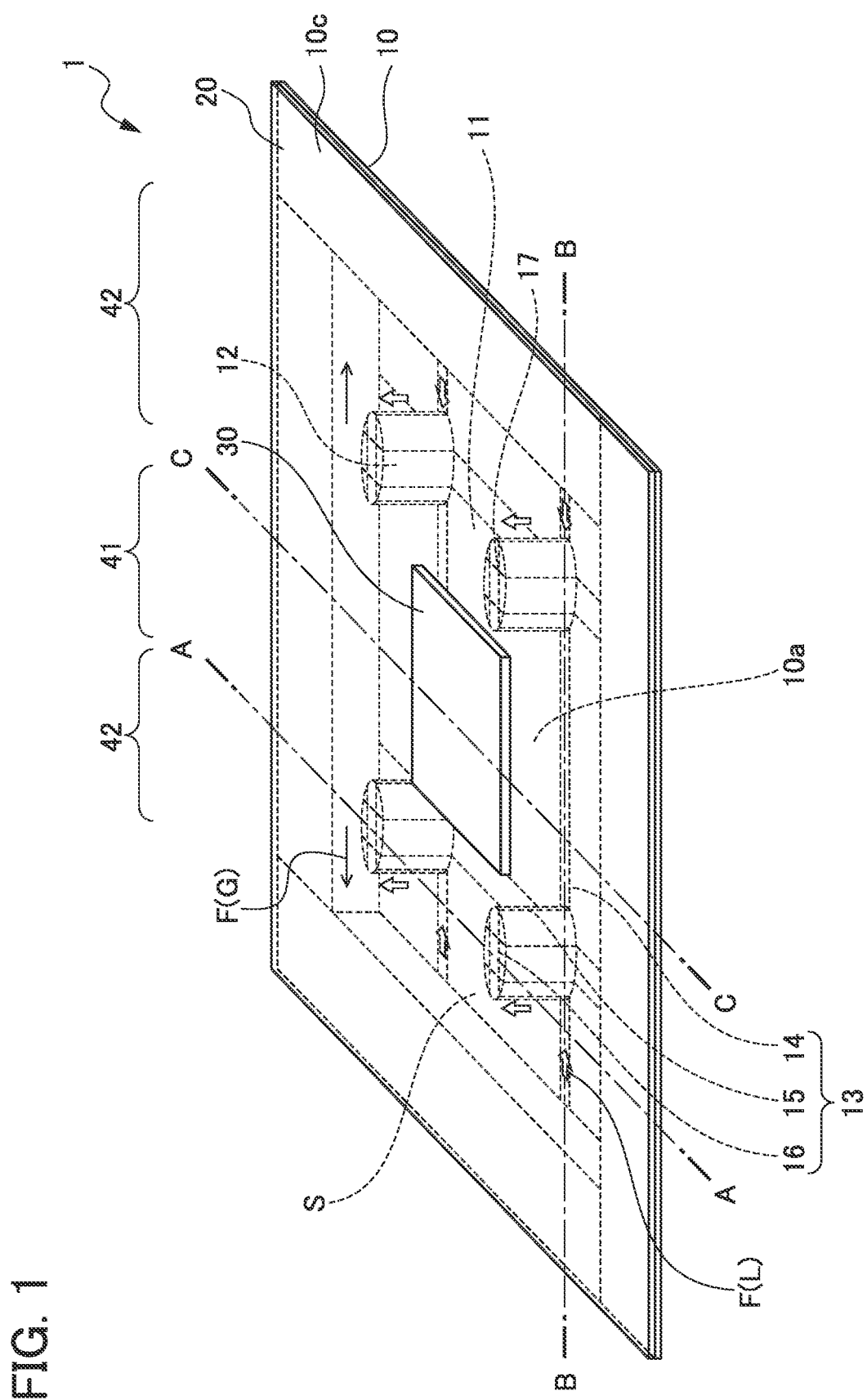
FIG. 1 is a perspective view showing an example of a vapor chamber according to an embodiment.
Figure 2:
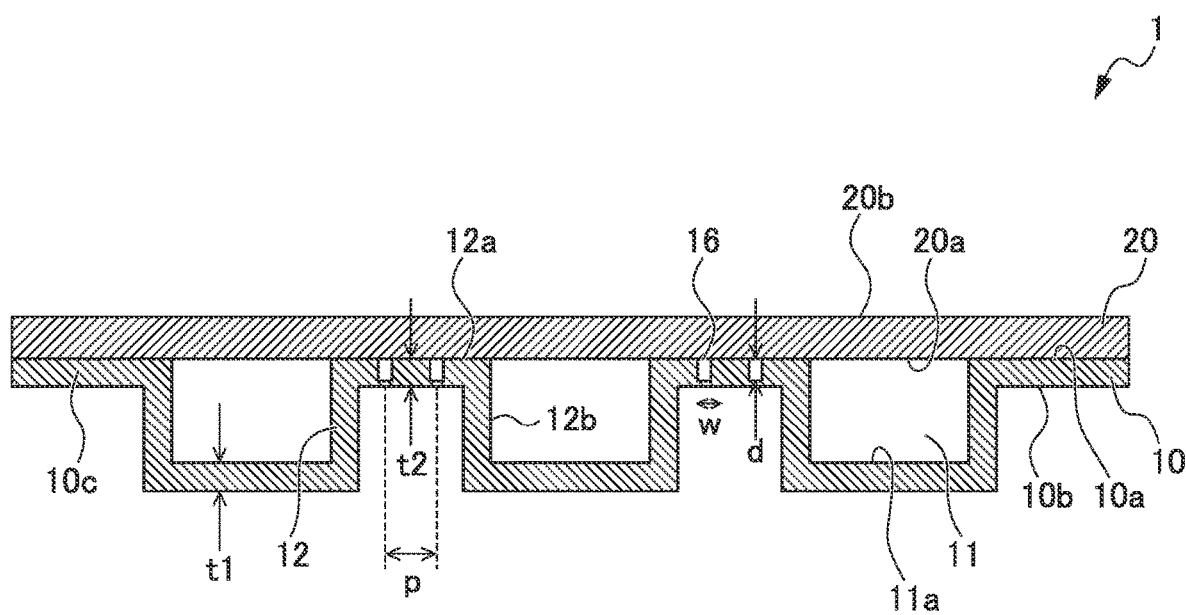
FIG. 2 is a cross-sectional view along the line A-A in FIG. 1.
Figure 3:
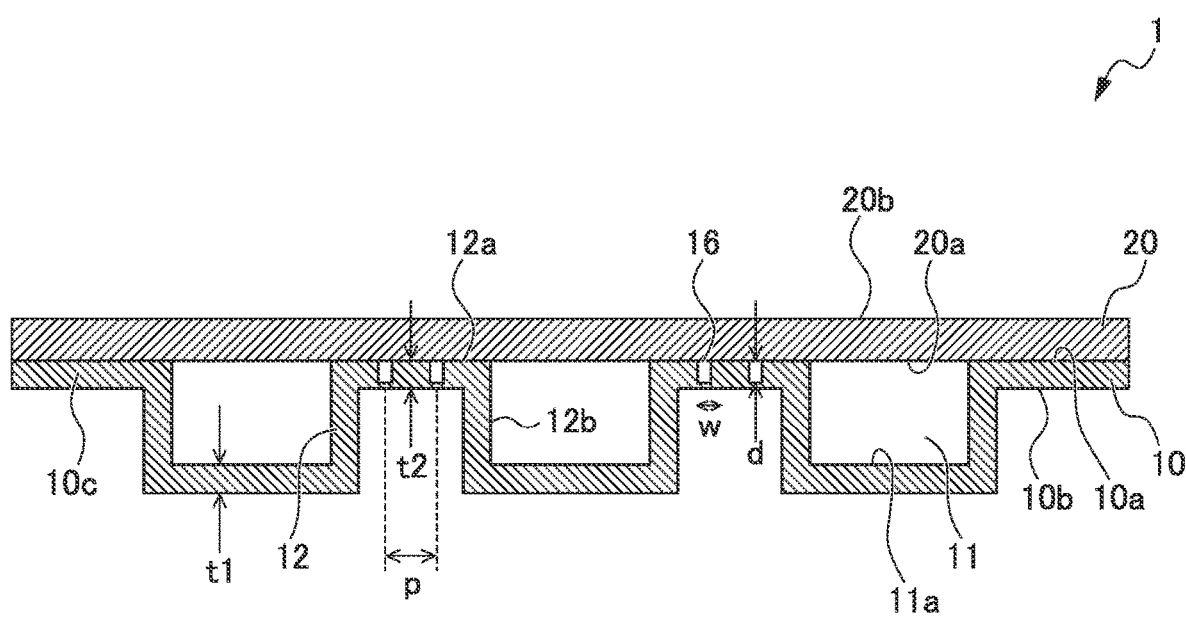
FIG. 3 is a cross-sectional view along the line B-B in FIG. 1.
Figure 4:
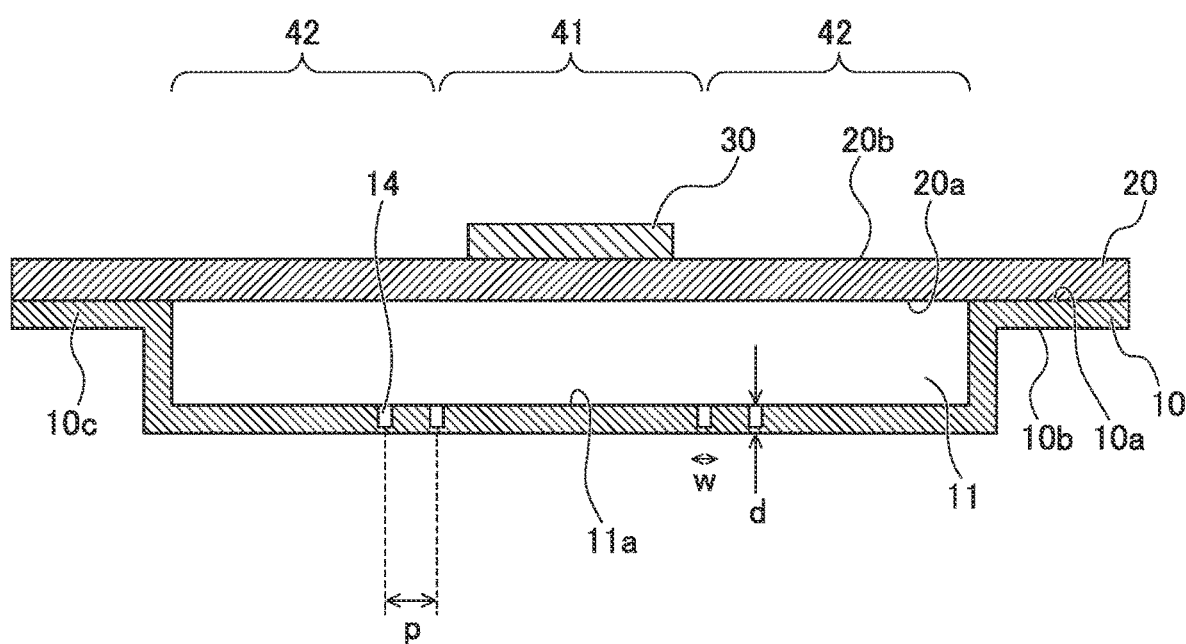
FIG. 4 is a cross-sectional view along the line C-C in FIG. 1.

FIG. 1 is a perspective view showing an example of a vapor chamber according to the embodiment. FIG. 2 is a cross-sectional view along the line A-A in FIG. 1. FIG. 3 is a cross-sectional view along the line B-B in FIG. 1. FIG. 4 is a cross-sectional view along the line C-C in FIG. 1. For convenience, FIG. 1 shows an aspect partially penetrating so that the internal structure of the vapor chamber is understood. In addition, FIG. 1 shows the flow direction of the liquid-phase working fluid F(L) by the black arrows, and shows the flow direction of the gas-phase working fluid F(G) by the white arrows.

As shown in FIGS. 1 to 4, the vapor chamber 1 of the embodiment has a first metal sheet 10 and a second metal sheet 20. The first metal sheet 10 and the second metal sheet 20 are joined so that an inner surface 10a of the first metal sheet 10 and an inner surface 20a of the second metal sheet 20 are opposing. In other words, the first metal sheet 10 and the second metal sheet 20 have the insides closed. In addition, the vapor chamber 1 has a working fluid in an internal space S formed between the first metal sheet 10 and the second metal sheet 20. The internal space S is sealed by the first metal sheet 10 and the second metal sheet 20. The working fluid is enclosed in the internal space S provided inside of the vapor chamber 1.

As the working fluid enclosed in the internal space S, pure water, ethanol, methanol, acetone, etc. can be exemplified from the viewpoint of cooling performance of the vapor chamber 1.

The first metal sheet 10 constituting the vapor chamber 1 includes a recessed channel 11, at least one projecting part 12, and at least one flow channel groove 13.

As shown in FIG. 1, the recessed channel 11 is provided at the inner surface 10a of the first metal sheet 10. The recessed channel 11 provided on the side of the inner surface 10a indents from an outer edge 10c of the first metal sheet 10 along the center of the inner surface 10a. For example, the recessed channel is a space from the internal space S excluding the projecting part 12 and flow channel groove 13. The gas-phase working fluid mainly flows in the recessed channel 11.

The projecting part 12 projects from the inner surface 10a of the first metal sheet 10 toward the inner surface 20a of the second metal sheet 20. A top face 12a of the projecting part 12 abuts the inner surface 20a of the second metal sheet 20.

The shape of the projecting part 12 is not particularly limited, so long as the top face 12a of the projecting part 12 can abut the inner surface 20a of the second metal sheet 20. In addition, in the case of the first metal sheet 10 including a plurality of the projecting parts 12, the shapes of the projecting parts 12 may be entirely the same, or may differ. Herein, an example is shown in which all of the projecting parts 12 are columnar.

The flow channel groove 13 has a bottom groove part 14, a side face groove part 15 and a top face groove part 16.

As shown in FIGS. 1 and 4, the bottom groove part 14 constituting the flow channel groove 13 is provided at the bottom 11a of the recessed channel 11. In addition, as shown in FIG. 1, the side face groove part 15 constituting the flow channel groove 13 is provided at a side face 12b of the projecting part 12, and is connected to the bottom groove part 14. In addition, as shown in FIGS. 1 to 3, the top face groove part 16 constituting the flow channel groove 13 is provided at the top face 12a of the projecting part 12, and is connected to the side face groove part 15. The liquid-phase working fluid flows in the flow channel groove 13.

The side face groove part 15 provided at the side face 12b of the projecting part 12 extends along the entire length from the bottom side to the top face side of the side face 12b. In this way, the side face groove part 15 extending in the height direction of the projecting part 12 extends along the entire length in the thickness direction of the vapor chamber 1 in the internal space S, from the inner surface 10a of the first metal sheet 10 until the inner surface 20a of the second metal sheet 20. In addition, a bottom side end of the side face groove part 15 is connected to the bottom groove part 14. A top face side end of the side face groove part 15 is connected to the top face groove part 16.

The groove width w of the flow channel groove 13 is very small compared to the width of the recessed channel 11. The shortest width of the recessed channel 11 is the shortest distance between adjacent projecting parts 12, or the shortest distance between the projecting part 12 and the outer edge 10c of the first metal sheet 10.

The groove depth d of the flow channel groove 13 is very small compared to the depth of the recessed channel 11. The depth of the recessed channel 11 is the distance from the inner surface 10a of the outer edge 10c until the bottom of the recessed channel.

The liquid-phase working fluid flows along the flow channel groove 13, as shown by the arrow F(L). When the flow channel groove 13 having the side face groove part 15 extending along the thickness direction of the vapor chamber 1, and having the bottom groove part 14 and the top face groove part 16 connected to the side face groove part 15, is provided in the internal space S, in addition to the disturbance in flow of the liquid-phase working fluid flowing along the in-plane direction of the vapor chamber 1 being suppressed by the bottom groove part 14 and top face groove part 16, the disturbance in flow of the liquid-phase working fluid flowing along the thickness direction of the vapor chamber 1 is suppressed by the side face groove part 15, and the liquid-phase working fluid favorably flows also in the thickness direction of the vapor chamber 1. When the liquid-phase working fluid favorably flows also in the thickness direction of the vapor chamber 1, it is possible to suppress a state in which the liquid-phase working fluid is not present in the evaporation part 41, i.e. dry-out, the flow of circulation of the liquid-phase working fluid and the gas-phase working fluid becomes favorable, and the heat transport within the internal space S improves. For this reason, the vapor chamber 1 can have superior heat transport characteristics.

Furthermore, when the flow channel groove 13 is provided in the internal space S, the working fluid favorably flows along the thickness direction of the vapor chamber 1 and the in-plane direction which is a direction perpendicular to the thickness direction of the vapor chamber 1. For example, even if the vapor chamber 1 is in any posture, such as a state in which the vapor chamber 1 shown in FIG. 1 is inclined by an angle of 90 degrees in the paper, or is in a state up-side down, the working fluid which becomes liquid phase from the gas phase in the condensation part 42 easily returns to the evaporation part 41. In this way, the heat transport characteristics of the vapor chamber 1 is superior, due to the flow of circulation of the liquid-phase working fluid and the gas-phase working fluid being favorable, independently of the arrangement state of the vapor chamber 1.

Furthermore, when the flow channel groove 13 is provided in the internal space S, the evaporation area of the working fluid in the internal space S increases, and the evaporation amount of the working fluid increases. As a result, the heat transport characteristics of the vapor chamber 1 increases due to the heat transport amount within the internal space S improving.

In addition, as shown in FIG. 1, for the bottom groove part 14, it is preferable for ends different from the end (also referred to as side face groove part-side end of bottom groove part) connecting with the side face groove part 15 to be connected to each other. When the ends of the bottom groove part 14 different from the side face groove part-side end are connected, the adjacent bottom groove parts 14 are connected. The flow of the liquid-phase working fluid along the inner surface 10a of the first metal sheet 10 improves. For this reason, the heat transport characteristics of the vapor chamber 1 improves.

In addition, as shown in FIG. 1, for the top face groove part 16, it is preferable for ends differing from the end (also referred to as side face groove part-side end of the top face groove part) connecting with the side face groove part 15 to be connected to each other. When the ends of the top face groove part 16 different from the side face groove part-side end are connected, the adjacent top face groove parts 16 are connected. The flow of the liquid-phase working fluid along the inner surface 20a of the second metal sheet 20 improves. For this reason, the heat transport characteristics of the vapor chamber 1 improves.

In addition, the flow channel groove 13 preferably has a groove depth d longer than the groove width w. When the groove depth d of the flow channel groove 13 is longer than the groove width w of the flow channel groove 13, the capillary phenomenon of the flow channel groove 13 relative to the liquid-phase working fluid tends to be exhibited. The liquid-phase working fluid favorably flows within the flow channel groove 13 by the capillary phenomenon of the flow channel groove 13. For this reason, the heat transport characteristics of the vapor chamber 1 further improves.

In addition, the groove width w of the flow channel groove 13 is preferably 20 µm or more and 200 µm or less, and more preferably 50 µm or more and 100 µm or less. The groove depth d and the groove width w of the flow channel groove 13 preferably has a ratio d/w of 2.0 or more and 20.0 or less. When the groove width w or the groove depth d of the flow channel groove 13 is the above-mentioned lower limit value or more, it is possible to easily form the flow channel groove 13. When the groove width w or the groove depth d of the flow channel groove 13 is the above-mentioned upper limit value or less, the capillary phenomenon of the flow channel groove 13 tends to act on the working fluid.

In addition, in the case of the first metal sheet 10 including a plurality of the flow channel grooves 13, the plurality of flow channel grooves 13 preferably extends in parallel to each other. In the case of the plurality of flow channel grooves 13 extending in parallel, the groove interval p of adjacent flow channel grooves 13 is preferably 40 µm or more and 400 µm or less, and more preferably 100 µm or more and 200 µm or less. The groove interval p of the flow channel grooves 13 is a distance between center lines of the groove width of adjacent flow channel grooves 13. When the groove interval p of the flow channel grooves 13 is 40 µm or more, it is possible to easily form the flow channel grooves 13. When the groove interval p of the flow channel grooves 13 is 400 µm or less, since the working fluid favorably flows within the internal space S, the heat transport characteristics of the vapor chamber 1 improves. In addition, the groove interval p is preferably at least 50 µm and no more than 100 µm larger than the groove width w. If the groove interval p and the groove width w are in such a relationship, it is possible to easily form the flow channel groove 13. In addition, since a large working fluid amount in the flow channel groove per unit area can be kept, dry out in which the working fluid disappears will hardly occur, and the heat transport amount performance of the vapor chamber 1 improves.

In addition, the groove width w of the bottom groove part 14 constituting the flow channel groove 13 is preferably 20 µm or more and 200 µm or less, and is more preferably 50 µm or more and 100 µm or less. The groove depth d and the groove width w of the bottom groove part 14 preferably has a ratio d/w of 2.0 or more and 20.0 or less. When the groove width w or the groove depth d of the bottom groove part 14 is the above-mentioned lower limit value or more, it is possible to easily form the bottom groove part 14. When the groove width w or the groove depth d of the bottom groove part 14 is the above-mentioned upper limit value or less, the capillary phenomenon of the bottom groove part 14 tends to further act on the working fluid.

In addition, the groove width w of the side face groove part 15 is preferably 20 µm or more and 200 µm or less, and is more preferably 50 µm or more and 100 µm or less. The groove depth d and the groove width w of the side face groove part 15 preferably has a ratio d/w of 2.0 or more and 20.0 µm or less. When the groove width w or the groove depth d of the side face groove part 15 is the above-mentioned lower limit value or more, it is possible to easily form the side face groove part 15. When the groove width w or the groove depth d of the side face groove part 15 is the above-mentioned upper limit value or less, the capillary phenomenon of the side face groove part 15 tends to further act on the working fluid.

In addition, the groove width w of the top face groove part 16 is preferably 20 µm or more and 200 µm or less, and is more preferably 50 µm or more and 100 µm or less. The groove depth d and the groove width w of the top face groove part 16 preferably has a ratio d/w of 2.0 or more and 20.0 µm or less. When the groove width w or the groove depth d of the top face groove part 16 is the above-mentioned lower limit value or more, it is possible to easily form the top face groove part 16. When the groove width w or the groove depth d of the top face groove part 16 is the above-mentioned upper limit value or less, the capillary phenomenon of the top face groove part 16 tends to further act on the working fluid.

In the formation of the flow channel groove 13 improving the heat transport characteristics of such a vapor chamber 1, particularly in the formation of the side face groove part 15 and the flow channel groove 13 having the above-mentioned predetermined groove width w, groove depth and groove interval p, a process using a laser is preferable, and thereamong, a process using a fiber laser is more preferable. In a process by laser, it is possible to form the flow channel groove 13 including the side face groove part 15 into a desired shape in a short time. On the other hand, in the etching process using an etching liquid adopted in conventional vapor chambers, the processability is very low compared to laser processing, such as the control of the shape of the flow channel groove 13 being difficult, and the formation itself of the side face groove part 15 being difficult.

In addition, the material constituting the first metal sheet 10 and the second metal sheet 20 is preferably copper, copper alloy, aluminum, aluminum alloy or stainless steel, from the viewpoint of high thermal conductivity, processing ease by laser, etc. Thereamong, for the purpose of achieving weight reduction, aluminum or aluminum alloy is more preferable, and for the purpose of raising the mechanical strength, stainless steel is more preferable. In addition, depending on the use environment, tin, tin alloy, titanium, titanium alloy, nickel, nickel alloy, etc. may be used in the first metal sheet 10 and the second metal sheet 20.

In addition, as shown in FIGS. 2 to 4, the ratio (t2/t1) of the sheet thickness t2 at the projecting part 12 of the first metal sheet 10 relative to the sheet thickness t1 at the recessed channel 11 of the first metal sheet 10 is preferably 0.1 or more and 10.0 or less, more preferably 0.2 or more and 5.0 or less, even more preferably 0.5 or more and 2.0 or less, and most preferably 1.0, i.e. the sheet thickness t1 at the recessed channel 11 and the sheet thickness t2 at the projecting part 12 are equal. When the ratio (t2/t1) is within the above-mentioned range, since the variation in sheet thickness of the first metal sheet 10 is suppressed, it is possible lighten the weight of the vapor chamber 1. In the formation of the first metal sheet 10 having such a predetermined ratio (t2/t1), processing by press molding is favorable.

In addition, as shown in FIG. 1, it is preferable that the first metal sheet 10 includes a plurality of flow channel grooves 13, and has a crossing part 17 at which the plurality of flow channel grooves 13 intersect. As the state in which the plurality of flow channel grooves 13 intersect, the plurality of flow channel grooves 13 may intersect at a right angle as shown in FIG. 1, or the plurality of flow channel grooves 13 may intersect at an angle other than a right angle. The crossing part 17 may be configured by a plurality of the bottom groove parts 14 intersecting, may be configured by a plurality of the side face groove parts 15 intersecting, or may be configured by a plurality of the top face groove parts 16 intersecting as shown in FIG. 1. The crossing part 17 configured by the plurality of bottom groove parts 14 is provided to the bottom face 11a of the recessed channel 11. The crossing part 17 configured by the plurality of side face groove parts 15 is provided to the side face 12b of the projecting part 12. The crossing part 17 configured by the plurality of top face groove parts 16 is provided to the top face 12a of the projecting part 12.

When the first metal sheet 10 has the crossing part 17, the capillary phenomenon of the crossing part 17 acts on the working fluid, in addition to the capillary phenomenon of the flow channel groove 13, and heat transport within the internal space S further improves. For this reason, the heat transport characteristics of the vapor chamber 1 further improves.

In addition, as shown in FIGS. 1 and 4, when mounting a heat generating body 30 to the outer face 20b of the second metal sheet 20, the position on the back surface of the heat generating body 30 on the inner surface 20a of the second metal sheet 20 becomes a condensation part 42, and the liquid-phase working fluid favorably flows to the top face groove part 16 from the bottom groove part 14 via the side face groove part 15. Since circulation of the liquid-phase working fluid and the gas-phase working fluid further improves, the heat transport characteristics of the vapor chamber 1 further improves. The heat generating body 30 is a member such as an electronic component which generates heat during operation, such as a semiconductor element, for example.

In addition, from the viewpoint of an improvement in heat transport characteristics of the vapor chamber 1, the projecting part 12 including the top face groove part 16 is preferably arranged at a position excluding the evaporation part 41.

The vapor chamber 1 cools the heat generating body 30 mainly by the following cooling path.

First, the heat generated by the heat generating body 30 thermally connected with the outer surface 20b of the second metal sheet 20 is transferred to the evaporation part 41 positioned at the inner surface 20a of the second metal sheet 20. The evaporation part 41 causes the liquid-phase working fluid flowing in the top face groove part 16 to evaporate and phase changes to gas-phase working fluid, by the heat received from the heat generating body 30. The gas-phase working fluid heated by evaporation flows to the condensation part 42 at a position distanced from the evaporation part 41, as shown by the arrow F(G). In the course of the gas-phase working fluid flowing toward the condensation part 42, the temperature of the working fluid drops. In the condensation part 42, the gas-phase working fluid which has dropped in temperature is condensed and phase changes to the liquid-phase working fluid. The latent heat generated by phase change is transferred to the first metal sheet 10 or the second metal sheet 20, and is radiated to outside of the vapor chamber 1. The condensed liquid-phase working fluid favorably flows in the in-plane direction of the vapor chamber 1, along the bottom groove part 14, as shown by the arrow F(L). When the liquid-phase working fluid flowing in the bottom groove part 14 reaches the side face groove part 15, the liquid-phase working fluid favorably flows in the thickness direction of the vapor chamber 1 along the side face groove part 15. The liquid-phase working fluid flowing in the thickness direction of the vapor chamber 1 returns to the evaporation part 41 again via the top face groove part 16. By such favorable circulation of the liquid-phase working fluid and the gas-phase working fluid, the vapor chamber 1 can cool the heat generating body 30.

Next, a manufacturing method of the above-mentioned vapor chamber 1 will be explained.

The manufacturing method of the vapor chamber 1 has a laser processing step of forming at least the side face groove part 15 among the flow channel groove 13 of the first metal sheet 10 by laser. In the laser processing step, it is preferable to form the side face groove part 15 by a fiber laser. In the laser processing, the side face grove part 15 tends to be process controlled to the desired shape, and the side face groove part 15 can be formed in a short time. Furthermore, among lasers, the fiber laser is more superior in processing control and short-time processing. On the other hand, in the etching process using an etchant adopted in a conventional vapor chamber, the formation of the side face groove part 15 itself is difficult.

In addition, in the laser processing step, forming the flow channel groove 13 by laser is preferable. In other words, it is preferable to form the bottom groove part 14, the side face groove part 15 and the top face groove part 16 constituting the flow channel groove 13 by laser. When using a laser, it is possible to form the flow channel groove 13 including the side face groove part 15 into the desired shape in a short time. On the other hand, in a conventional etching process, it is difficult to conduct processing control of the flow channel groove 13 including the side face groove part 15 into the desired shape.

In addition, the manufacturing method of the vapor chamber 1 preferably further includes a press processing step of forming the recessed channel 11 and the projecting part 12 of the first metal sheet 10 by press molding, prior to the laser processing step. By press molding the first metal sheet 10, it is possible to easily form the recessed channel 11 and the projecting part 12.

In addition, the manufacturing method of the vapor chamber 1 preferably further includes a laser welding step of welding the first metal sheet 10 and the second metal sheet 20 by laser, after the laser processing step. By welding the first metal sheet 10 and the second metal sheet 20 by laser, it is possible to easily manufacture the vapor chamber 1 including the internal space S inside.

More specifically, the inner surface 10*a* of the first metal sheet 10 including the recessed channel 11, the projecting part 12, the flow channel groove 13, etc. and the inner surface 20*a* of the second metal sheet 20 are opposing each other, and the laser is irradiated onto the first metal sheet 10 and the second metal sheet 20 in a state in which the outer edge 10*c* of the first metal sheet 10 and the inner surface 20*a* of the second metal sheet 20 are contacting. For example, the laser may be irradiated onto the contacting portion of the first metal sheet 10 and the second metal sheet 20 from the side of the first metal sheet 10, the laser may be irradiated onto the contacting portion of the first metal sheet 10 and the second metal sheet 20 from the side of the second metal sheet 20, the laser may be irradiated onto the contacting portion of the first metal sheet 10 and the second metal sheet 20 from the in-plane direction of the vapor chamber 1, or the irradiation of these lasers may be combined.

In addition, the above-mentioned vapor chamber 1 is suitably used in electronic devices such as portable telephones, for which good heat transport characteristics are required even in various postures. The electronic device equipped with the vapor chamber 1 has high heat transport characteristics of the vapor chamber 1, even in various usage states.

According to the above explained embodiment, the liquid-phase working fluid in the internal space of the vapor chamber favorably flows also in the thickness direction of the vapor chamber along the flow channel groove. Since disturbance in the flow of the liquid-phase working fluid is suppressed, the flow of circulation of the liquid-phase working fluid and the gas-phase working fluid improves, and the heat transfer within the internal space of the vapor chamber increases. For this reason, the vapor chamber can have superior heat transfer characteristics.

It should be noted that, although the above illustrates an example mounting a heat generating body 30 to the outer surface 20*b* of the second metal sheet 20 as shown in FIG. 1, the heat generating body 30 may be mounted to the outer surface 10*b* of the first metal sheet 10.

In addition, although the above illustrates an example in which the inner surface 20*a* of the second metal sheet 20 is flat, in addition to the first metal sheet 10, the inner surface 20*a* of the second metal sheet 20 may have the bottom groove part 14. When the second metal sheet 20 has the bottom groove part 14, the heat transfer characteristics of the vapor chamber 1 further improve.

In addition, although the above illustrates an example in which the inner surface 20*a* of the second metal sheet 20 is flat, the inner surface 20*a* of the second metal sheet 20 may have any of the configurations of the recessed channel, at least one projecting part and at least one flow channel groove, similarly to the inner surface 10*a* of the first metal sheet 10. When the second metal sheet 20 has the recessed channel, at least one projecting part or at least one flow channel groove, the heat transfer characteristics of the vapor chamber 1 further improve.

Figure 5:
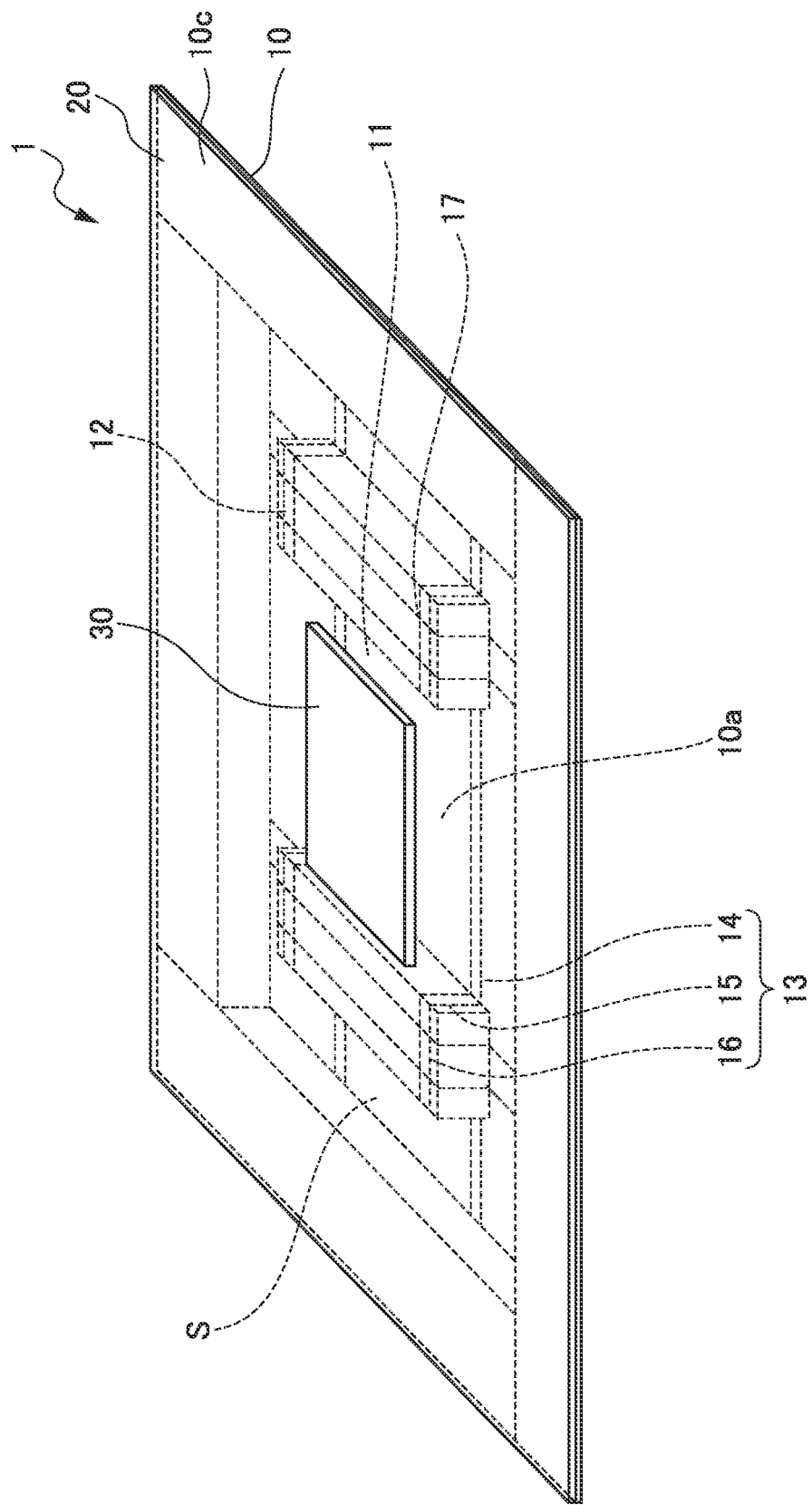
FIG. 5 is a perspective view showing another example of a vapor chamber according to an embodiment.

In addition, although the above illustrates an example in which the projecting part 12 is cylindrical as shown in FIG. 1, the shape of the projecting part 12 is sufficient so long as the top face 12*a* can abut the inner surface 20*a* of the second metal sheet 20. For example, the shape of the projecting part 12 may be a square column, as shown in FIG. 5.

Figure 6:
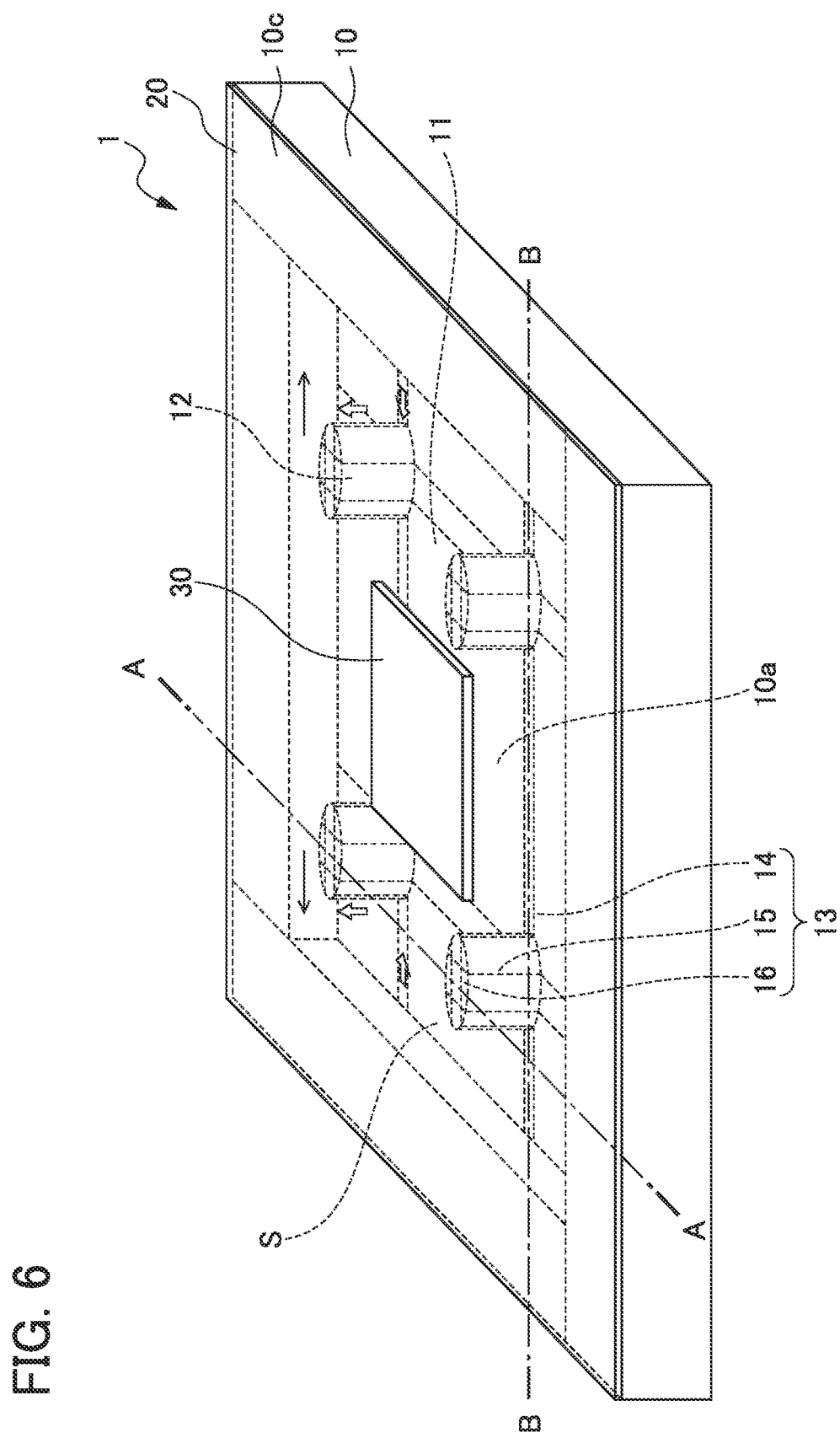
FIG. 6 is a perspective view showing another example of a vapor chamber according to an embodiment.
Figure 7:
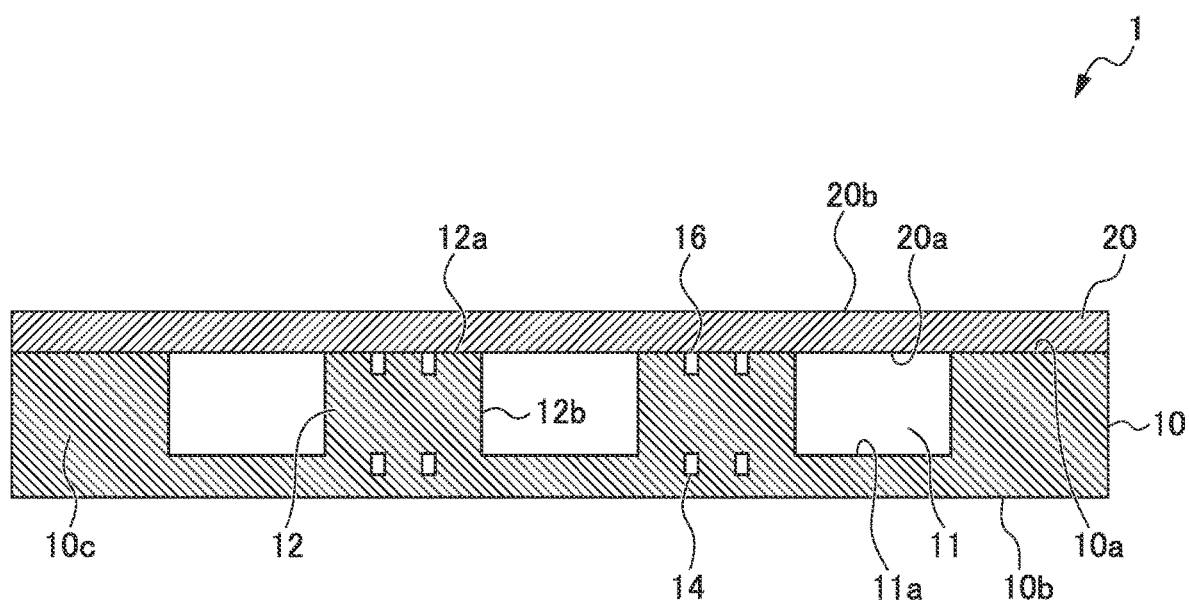
FIG. 7 is a cross-sectional view along the line A-A in FIG. 6.
Figure 8:
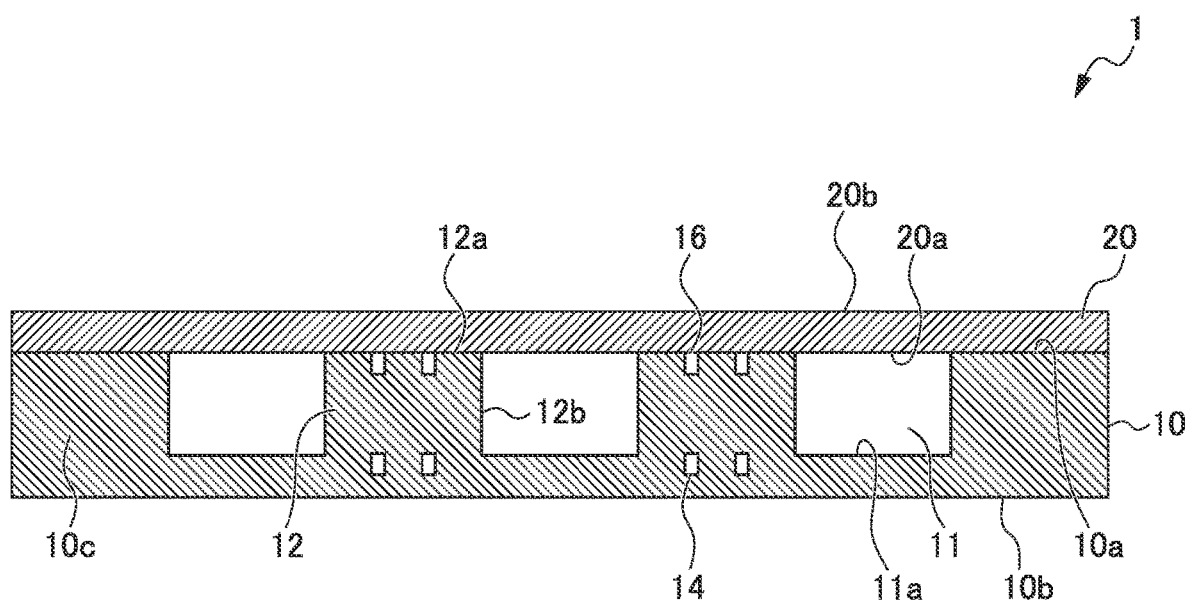
FIG. 8 is a cross-sectional view along the line B-B in FIG. 6.

In addition, although the above illustrates an example in which the uniformity of the sheet thickness of the first metal sheet 10 is high as shown in FIGS. 1 to 4, the sheet thickness at the projecting part 12 of the first metal sheet 10 may be clearly greater than the sheet thickness at the recessed channel 11, as shown in FIGS. 6 to 8. In this case, the bottom groove part 14 may enter part of the projecting part 12, and preferably penetrates the projecting part 12 as illustrated. If the bottom groove part 14 enters part of the projecting part 12 or penetrates the projecting part 12, since the liquid-phase working fluid flows more favorably, the heat transfer characteristics of the vapor chamber 1 further improve.

Although an embodiment has been explained above, the present invention encompasses all aspects included in the gist of the present disclosure and the claims without being limited to the above-mentioned embodiment, and can be modified in various ways within the scope of the present disclosure.

EXPLANATION OF REFERENCE NUMERALS 1 vapor chamber
10 first metal sheet
10*a* inner surface of first metal sheet
10*b* outer surface of first metal sheet
10*c* outer edge of first metal sheet
11 recessed channel
11*a* bottom of recessed channel
12 projecting part
12*a* top face of projecting part
12*b* side face of projecting part
13 flow channel groove
14 bottom groove part
15 side face groove part
16 top face groove part
17 crossing part
20 second metal sheet
20*a* inner surface of second metal sheet
20*b* outer surface of second metal sheet
30 heat generating body
41 evaporation part
42 condensation part
S internal space
F(L) flow of liquid-phase working fluid
F(G) flow of gas-phase working fluid

The invention claimed is:

1. A vapor chamber having a working fluid in an internal space formed between a first metal sheet and a second metal sheet, wherein:
    the first metal sheet comprises a recessed channel, at least one projecting part, and at least one flow channel groove,
    the recessed channel is provided at an inner surface of the first metal sheet,
    the projecting part projects from the inner surface of the first metal sheet toward an inner surface of the second metal sheet, and a top face of the projecting part abuts the inner surface of the second metal sheet,
    the flow channel groove has a bottom groove part, a side face groove part and a top face groove part,
    the bottom groove part is provided at a bottom face of the recessed channel,
    the side face groove part is provided at a side face of the projecting part, and is connected to the bottom groove part, and
    the top face groove part is provided at the top face of the projecting part, and is connected to the side face groove part,
    wherein,
    the bottom groove part, the side face groove part and the top face groove part form a sealed space,
    the top groove part is higher than the side face groove part,
    for the top face groove part, first ends differing from second ends connecting with the side face groove part are connected to each other, or
    for the bottom face groove part, third ends differing from fourth ends connecting with the side face groove part are connected to each other.

2. The vapor chamber according to claim 1, wherein each of the bottom groove part, the side face groove part and the top face groove part of the flow channel groove has a groove depth d and a groove width w with the groove depth d being longer than the groove width w.

3. The vapor chamber according to claim 1, wherein a ratio (t2/t1) of a sheet thickness t2 at the projecting part of the first metal sheet relative to a sheet thickness t1 at the recessed channel of the first metal sheet is 0.1 or more and 10.0 or less.

4. The vapor chamber according to claim 1, wherein the first metal sheet includes a plurality of the flow channel grooves, and has a crossing part at which the plurality of the flow channel grooves intersect.

5. The vapor chamber according to claim 2, wherein a ratio (t2/t1) of a sheet thickness t2 at the projecting part of the first metal sheet relative to a sheet thickness t1 at the recessed channel of the first metal sheet is 0.1 or more and 10.0 or less.

6. The vapor chamber according to claim 2, wherein the first metal sheet includes a plurality of the flow channel grooves, and has a crossing part at which the plurality of the flow channel grooves intersect.

7. The vapor chamber according to claim 3, wherein the first metal sheet includes a plurality of the flow channel grooves, and has a crossing part at which the plurality of the flow channel grooves intersect.

8. The vapor chamber according to claim 1, wherein the bottom groove part, the side face groove part and the top face groove part form a sealed space.

9. The vapor chamber according to claim 1, wherein the top groove part is higher than the side face groove part.

10. The vapor chamber according to claim 1, wherein for the top face groove part, first ends differing from second ends connecting with the side face groove part are connected to each other.

11. The vapor chamber according to claim 1, wherein for the bottom face groove part, third ends differing from fourth ends connecting with the side face groove part are connected to each other.

* * * * *